(12) United States Patent
Yoon et al.

(10) Patent No.: US 10,593,824 B2
(45) Date of Patent: Mar. 17, 2020

(54) ULTRA-THIN FLEXIBLE REAR-CONTACT SI SOLAR CELLS AND METHODS FOR MANUFACTURING THE SAME

(71) Applicant: The Government of the United States of America, as represented by the Secretary of the Navy, Arlington, VA (US)

(72) Inventors: Woojun Yoon, Fairfax, VA (US); David Scheiman, Alexandria, VA (US); Phillip Jenkins, Cleveland Heights, OH (US); Robert J. Walters, Alexandria, VA (US)

(73) Assignee: The Government of the United States of America, as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 16/264,845

(22) Filed: Feb. 1, 2019

(65) Prior Publication Data
US 2019/0245111 A1      Aug. 8, 2019

Related U.S. Application Data

(60) Provisional application No. 62/625,359, filed on Feb. 2, 2018.

(51) Int. Cl.
*H01L 31/18* (2006.01)
*H01L 31/0224* (2006.01)
*H01L 31/0236* (2006.01)

(52) U.S. Cl.
CPC .... *H01L 31/1868* (2013.01); *H01L 31/02363* (2013.01); *H01L 31/022441* (2013.01); *H01L 31/1804* (2013.01); *H01L 31/1892* (2013.01)

(58) Field of Classification Search
None
See application file for complete search history.

(56) References Cited

U.S. PATENT DOCUMENTS

| 8,399,287 B1 | 3/2013 | Mulligan et al. |
| 8,481,357 B2 * | 7/2013 | Kumar ............ H01L 31/02168 136/244 |

(Continued)

FOREIGN PATENT DOCUMENTS

KR      20130026007 A     3/2013

OTHER PUBLICATIONS

W. Yoon, et al., "Transparent conducting oxide based, passivated contacts for high efficiency crystalline Si solar cells," 2015 IEEE 42nd Photovoltaic Specialist Conference (PVSC), 2015, pp. 1-4.

(Continued)

*Primary Examiner* — Asok K Sarkar
(74) *Attorney, Agent, or Firm* — US Naval Research Laboratory; Joslyn Barritt (57) ABSTRACT

A method for making an ultra-thin, flexible crystalline silicon solar cell from thick, inflexible cells. A thick, inflexible cell having a plurality of electrical contacts on the back side thereof is adhered to a mount by means of a temporary bonding adhesive tape and a thickness of the mounted stack. A thickness of the bonding tape and the back-side contacts is determined and compared to a desired thickness of the final cell. Excess material is ground from the front side of the stack to obtain a thinned stack having the desired thickness and the thinned stack is removed from the mount to produce an ultra-thin, flexible rear-contact Si solar cell having a total thickness of less than 80 μm and a bending radius of less than 20 mm. The front surface can be textured, with a passivation layer and/or a dielectric layer being deposited thereon.

11 Claims, 6 Drawing Sheets

(56) References Cited

U.S. PATENT DOCUMENTS

| | | | |
|---|---|---|---|
| 9,178,105 B2 | 11/2015 | Lochtefeld et al. | |
| 9,842,949 B2* | 12/2017 | Moslehi | H01L 31/02244 |
| 2010/0003804 A1 | 1/2010 | Eguchi et al. | |
| 2012/0142139 A1 | 6/2012 | Varghese | |
| 2013/0228221 A1 | 9/2013 | Moslehi et al. | |
| 2013/0237001 A1 | 9/2013 | Forrest et al. | |
| 2014/0318611 A1* | 10/2014 | Moslehi | H01L 31/02244 136/256 |
| 2015/0258769 A1 | 9/2015 | Farah | |

OTHER PUBLICATIONS

W. Yoon, et al., "Enhanced surface passivation of epitaxially grown emitters for high efficiency ultrathin crystalline Si solar cells," 2016 IEEE 43rd Photovoltaic Specialists Conference (PVSC), 2016, pp. 3008-3010.

Rolf Brendel, "Review of Layer Transfer Processes for Crystalline Thin-Film Silicon Solar Cells," Jpn. J. Appl. Phys. vol. 40 (2001) pp. 4431-4439.

Evan Franklin et al, "Design, fabrication and characterisation of a 24.4% efficient interdigitated back contact solar cell," Prog. Photovolt: Res. Appl. (2014).

Keiichiro Masuko et al., "Achievement of More Than 25% Conversion Efficiency With Crystalline Silicon Heterojunction Solar Cell," IEEE Journal of Photovoltaics, vol. 4, No. 6, Nov. 2014, pp. 1433-1435.

David D. Smith et al, "SunPower's Maxeon Gen III solar cell: High Efficiency and Energy Yield," 2013 IEEE 39th Photovoltaic Specialists Conference (PVSC), pp. 0908-0913.

Rajesh Rao, "High efficiency heterojunction solar cell on 30 μm thin c-Si substrates using novel exfoliation technology," Final Scientific Report for DOE/EERE (2012).

Search Report and Written Opinion dated May 17, 2019 in corresponding International Application PCT/US2019/016239.

\* cited by examiner

ULTRA-THIN FLEXIBLE REAR-CONTACT SI SOLAR CELLS AND METHODS FOR MANUFACTURING THE SAME

CROSS-REFERENCE

This Application is a Nonprovisional of and claims the benefit of priority under 35 U.S.C. § 119 based on U.S. Provisional Patent Application No. 62/625,359 filed on Feb. 2, 2018. The Provisional application and all references cited herein are hereby incorporated by reference into the present disclosure in their entirety.

TECHNICAL FIELD

The present disclosure relates to ultra-thin flexible rear-contact Si solar cells and methods for manufacturing the same from commercial off-the-shelf rear-contact Si solar cells that are thick and limited in flexibility and bendability.

BACKGROUND

Rear-contact rear-junction Si solar cells or so-called "interdigitated-back-contact (IBC)" Si solar cells (hereinafter "rear-contact Si solar cells") put both front and rear contact on the rear of the cell. Rear-contact Si solar cells offer numerous advantages over conventional front-contact solar cells, including the elimination of optical loss resulting from the solar cell being subjected to shade, and exhibit significant improvement in current output and a higher packing density in module fabrication as compared to conventional front-contact Si solar cells.

Conventional high-efficiency rear-contact Si solar cells are commercial off-the-shelf products manufactured using n- or p-type mono- or multicrystalline Si wafers having a wafer thickness of approximately 200 µm as a starting material, resulting an inflexible rear-contact Si solar cell having a total thickness of about 165 µm.

Although such rear-contact Si solar cells provide significant advantages compared to front-contact Si solar cells, commercially available rear-contact Si solar cells exhibit a limited flexibility in bend radius, as measured by the inside curvature of the cell when it is flexed. The bend radius is the minimum radius one can bend a wafer without it being ruptured by the applied stress. The smaller the bend radius, the greater is the material flexibility and bendability.

The limited flexibility of conventional solar cells is due to the use of thick Si wafers having a thickness of about 200 µm as starting materials. Although inherently ultra-thin Si wafers exhibiting full flexibility can be employed as starting materials for fabrication of flexible solar cells, processing and handling of such ultra-thin silicon wafers are troublesome because of their fragile material nature, especially for wafer-level implementation of commercially available solar cell manufacturing with multiple processing steps. In addition, use of ultra-thin Si wafers as starting materials for manufacturing rear-contact, rear-junction solar cells is even more challenging particularly due to complex and multiple processing steps for rear-contact and rear junction formation in making rear-contact Si solar cells such as diffusion processes at high temperature, multiple deposition of thin-films, and the need for very complex and multiple photolithography steps.

Commercially available rear-contact Si solar cells typically are manufactured using n-type Si wafers with a wafer thickness of approximately 200 µm as a starting material. Multiple photolithography steps or printing techniques are used in selectively forming mask for use in etching of silicon dioxide and diffusing dopant and in forming metal contacts in diffused region on the back side of n-type Si wafer.

A key feature of rear-contact Si solar cells is that both p-doped and n-doped regions are alternatively formed in a back surface of the wafer through use of multiple masking and chemical etching technique and diffusion processes. Metal contacts are then made to the p- and n-regions on the backside by forming a seed layer stack, followed by thickening a seed layer by plating ≥20-µm copper and ≥7-µm tin. These interdigitated lines of thick back metals provide a robust foundation for the cell. In a front-side of rear-contact solar cells, the front-surface is chemical etched to form random-pyramids textured Si surfaces, then n-doped region is formed on the textured surface. A dielectric layer stack is then deposited to form anti-reflection coating (ARC) layers. A total thickness of a completed conventional rear-contact solar cell is about 165 µm, with the cell exhibiting a limited bending radius in the range from 50 mm to 60 mm.

Commercial off-the-shelf inflexible rear-contact Si solar cells can be converted to ultra-thin and fully flexible rear-contact Si solar cells via wafer thinning when a thickness of an active Si layer becomes less than 20 µm and thus the bend radius is in the range of 10 mm to 20 mm. This method requires adequate temporary bonding-debonding techniques to achieve cell thinning with no breakage and no damage. However, because of the extensive bumped features exhibited by the back sides of commercial off-the-shelf rear-contact solar cells due to thick interdigitated-back-contact lines, the mechanical properties and electrical performance of such wafer-thinned cells are significantly affected by the choice of the temporary bonding-debonding methods used and the quality of the bonded fixture during the thinning process. When the total thickness variation (TTV) after thinning process is fairly large (e.g., more than 10 µm), it significantly degrades the mechanical strength of thinned solar cell. In addition, generation of micro-cracks on both the front and rear sides of the solar cell during the thinning process is one of the major causes of breakage. Under an applied load, the concentrated stress at the defect degrades the mechanical strength of the thinned solar cell, eventually causing it to fracture. Such defects on the front side can be mitigated in some extent by employing chemical mechanical polishing after thinning, but the process is not cost-effective for use in conventional low-cost solar cell fabrication.

Temporary bonding wax that can be applied onto a thick wafer or a thin-film format is a widely used technique for wafer thinning. However, the bonding wax technique requires an additional step for spin-coating wax or delicate lamination requiring lamination tools and sometimes requires an aggressive solvent for removal of wax residue. Adhesive tape-based temporary bonding-debonding techniques can simplify application of temporary bonding adhesive, dramatically improving thinning process productivity without a spin-coater or laminator. Generally, temporary bonding adhesive tape is supported on polymer films, such as poly-(ethylene terephthalate) (PET), polyimide (PI), polystyrene (PS) or liquid crystal polymer (LCP). On the top of the polymer film, a compression layer with the thickness between 150 µm and 300 µm provides a conformable compression for highly bumped surfaces, followed by a 100-µm thick adhesive. Temporary bonding adhesive tape can be released depending of the release mechanism, such as, UV exposed release, controlled peel release or heat curing release. For low-cost and large arear solar cell application, an adhesive tape based on heat-curing release provides damage-free, fast release of solar cell from temporary boding adhesive tape with no or minimal adhesive residues. The adhesive layer on the top surface are protected by a protective release liner, which need to be removed prior to applying the adhesive tape onto the substrate.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention relates generally to ultra-thin flexible rear-contact Si solar cells and methods for manufacturing the same from pre-existing rear-contact Si solar cells that are thick and limited in bend radius. In particular, it relates to a temporary bonding-debonding technique for mounting the pre-existing thick, inflexible rear-contact Si solar cell on a temporary adhesive support layer during thinning process and for removing the temporary adhesive support layer and residual adhesive.

The present invention utilizes pre-existing thick, inflexible crystalline Si solar cells having a rear-contact and rear-junction cell structure as starting materials to manufacture ultra-thin, flexible rear-contact Si solar cells using a simple method that does not require any epitaxial Si growth systems, additional permanent supporting substrates, or complex and multiple photolithography steps.

In many embodiments, the pre-existing cell will be a conventional commercial off-the-shelf solar cell. Such commercial off-the-shelf rear-contact Si solar cells typically have p-doped and n-doped regions on the back side of the Si wafer, with interdigitated metal contacts having a thickness of 20 µm or more directly contacted to the p- and n-doped regions. These interdigitated metal stacks provide a robust foundation to the cell even without the need for a permanent support layer making the structure of such conventional rear-contact Si solar cells highly suitable for processing it to the ultra-thin flexible solar cells. Wafer thinning processes such as mechanical backgrinding or chemical etching can readily be applied to the front side of the pre-existing rear-contact solar cells without damaging any doped regions and metal contacts on the back side. After removing a portion of a front side via wafer thinning process, performance of thinned solar cells can be readily recovered by implementing anti-reflection coating layer, surface texturing and front-surface field layer to the front side of cell, thus enabling thinned rear-contact solar cells to have minimum losses in solar cell performance.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention relates generally to ultra-thin flexible rear-contact Si solar cells without a permanent support structure and methods for manufacturing the same from pre-existing rear-contact Si solar cells that are thick and limited in bend radius. In particular, it relates to a temporary bonding-debonding technique for mounting the pre-existing thick, inflexible rear-contact Si solar cell on a temporary adhesive support layer during the thinning process and for removing the support layer and residual adhesive.

The present invention utilizes pre-existing thick, inflexible crystalline Si solar cells having a rear-contact and rear-junction cell structure as starting materials to manufacture ultra-thin, flexible rear-contact Si solar cells using a simple method that does not require any epitaxial Si growth systems, additional permanent supporting substrates, or complex and multiple photolithography steps.

In many embodiments, the pre-existing cell will be a conventional commercial off-the-shelf solar cell. Such commercial off-the-shelf rear-contact Si solar cells typically have p-doped and n-doped regions on the back side of the Si wafer, with interdigitated metal contacts having a thickness of 20 µm or more directly contacted to the p- and n-doped regions. These interdigitated metal stacks provide a robust foundation to the cell even without the need for an additional permanent support layer making the structure of such conventional rear-contact Si solar cells highly suitable for processing it to the ultra-thin flexible solar cells. Wafer thinning processes such as mechanical backgrinding or chemical etching can readily be applied to the front side of the pre-existing rear-contact solar cells without damaging any doped regions and metal contacts on the back side. After removing a portion of a front side via wafer thinning process, performance of thinned solar cells can be readily recovered by implementing anti-reflection coating layer, surface texturing and front-surface field layer to the front side of cell, thus enabling thinned rear-contact solar cells to have minimum losses in solar cell performance.

Figure 1:
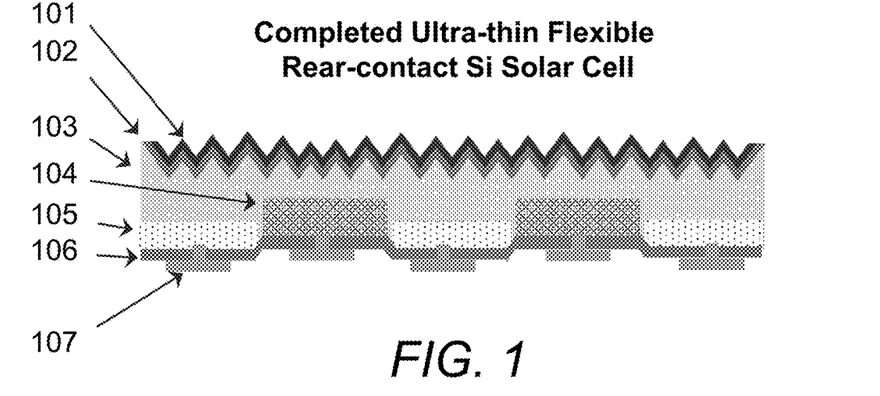
FIG. 1 is a block schematic illustrating aspects of an exemplary ultra-thin flexible rear-contact Si solar cell in accordance with the present invention.

FIG. 1 illustrates aspects of an exemplary ultra-thin flexible rear-contact Si solar cell in accordance with the present invention. As illustrated in FIG. 1, such an ultra-thin flexible rear-contact Si solar cell includes an ultra-thin n-type Si wafer 103 having a thickness between about 1 µm and about 20 and rear metal grids 107 having a thickness between about 20 µm and about 40 µm which form metal contacts in n-diffused region 104 and p-diffused region 105 on the back side of the n-type Si wafer. Each of these regions will be described in more detail below. In a preferred embodiment, the solar cell will be based on a (100) oriented monocrystalline Si wafer, with a KOH-based solution being used to preferentially expose the (111) planes of Si on the front side and form a textured surface with random upright pyramids having heights ranging from 1 µm to 5 µm, as illustrated in FIG. 1. In many embodiments, the cell can further include an n-doped semiconductor layer 102 on the front textured surface, and may further include an anti-reflection coating (ARC) layer 101 on the n-doped semiconductor layer 102.

As described in more detail below, such a solar cell is made by the method of the present invention which utilizes pre-existing thick, inflexible mono- or multi-crystalline Si solar cells to produce ultra-thin rear-contact mono- and multi-crystalline Si solar cells preferably having a total cell thickness of less than 80 µm, more preferably a thickness of less than 60 µm and that preferably exhibit a bend radius of less than 20 mm, more preferably less than 10 mm. The method of the present invention further provides flexible ultra-thin mono- and multi-crystalline silicon solar cells that preferably have rear-contact and rear-junction cell structure and have no permanent supporting substrate attached to them.

The method of the present invention achieves this by using a temporary bonding-debonding technique for mounting the inflexible and commercial off-the-shelf rear-contact Si solar cell on a temporary adhesive support layer during a thinning process and for removing the support layer and residual adhesive.

Figure 2:
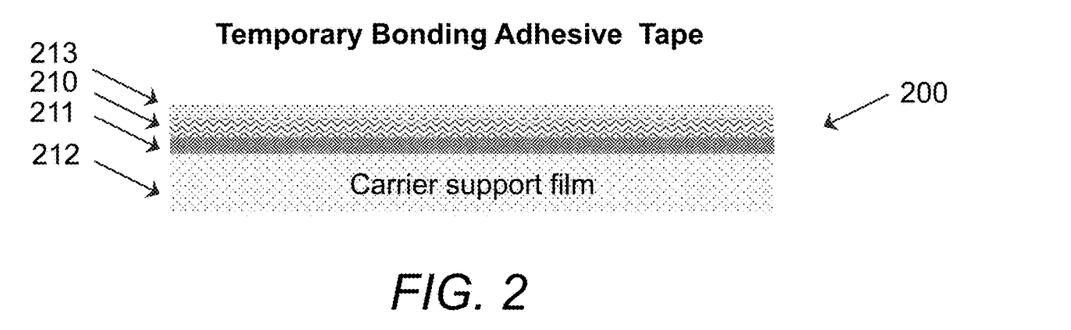
FIG. 2 is a block schematic illustrating aspects of exemplary temporary bonding adhesive tape used in a method for manufacturing an ultra-thin flexible rear-contact Si solar cell in accordance with the present invention.

FIG. 2 illustrates aspects of the temporary bonding feature of the method of the present invention. In accordance with the present invention, a temporary bonding adhesive tape having a total thickness from 300 µm to 500 µm is used to temporarily secure the pre-existing thick Si solar cell to a mount so that its thickness may be reduced to produce an ultra-thin, flexible crystalline Si solar cell. As illustrated in FIG. 2, this temporary bonding adhesive tape 200 comprises a carrier support film 212, typically a polymer film having a thickness of 75 µm such as poly-(ethylene terephthalate) (PET), polyimide (PI), polystyrene (PS) or liquid crystal polymer (LCP). On the top of carrier support film 212 is a compression layer 211 having a thickness between 150 µm and 300 µm, which provides conformable compression for highly uneven surfaces, followed by a 50-µm thick adhesive layer 210 on top of the compression layer, with the adhesive layer being protected by a protective release liner 213. The adhesive layer 210 has a melting temperature in the range from 70° C. to 150° C.

This temporary bonding adhesive tape is then used in the method of the present invention, as described below.

Figure 3A:
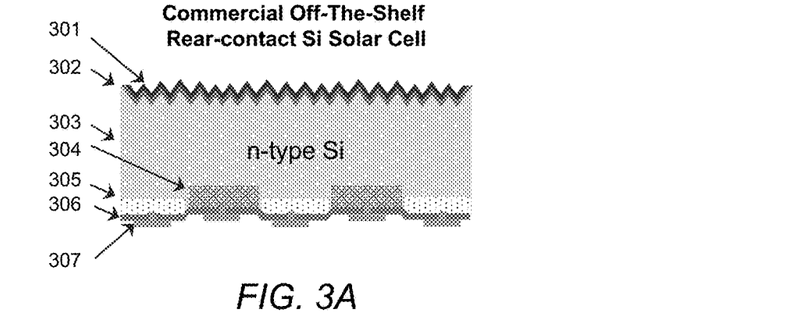
FIGS. 3A-3C are block schematics illustrating exemplary steps for making a bonded solar cell used in a method for manufacturing an ultra-thin flexible rear-contact Si solar cell in accordance with the present invention.
Figure 3B:
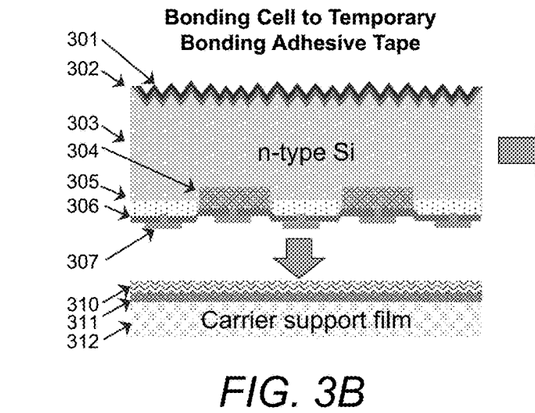
Figure 3C:
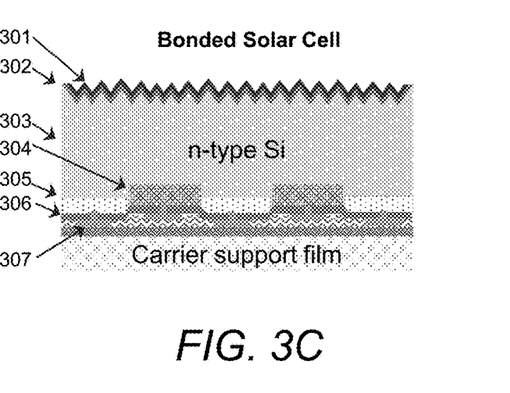

FIGS. 3A-3C are block schematics illustrating aspects of a method for manufacturing an ultra-thin, flexible crystalline Si solar cell from a preexisting thick crystalline Si solar cell in accordance with the present invention.

Thus, in a first step of a method for manufacturing an ultra-thin, flexible crystalline Si solar cell in accordance with the present invention, a pre-existing thick crystalline Si solar cell is provided and is used as the starting material for manufacture of the ultra-thin solar cell. As illustrated in FIG. 3A, such a pre-existing, commercially available rear-contact Si solar cell is manufactured using an n-type Si wafer 303 and has a wafer thickness of approximately 200 µm.

A key feature of the pre-existing rear-contact Si solar cell used is that n-doped (304) and p-doped (305) regions are alternately formed on a back surface of the wafer through use of a masking and chemical etching technique, whereby a silicon dioxide layer 306 is deposited on a back surface of the Si wafer and photolithography steps or printing techniques are used to selectively form a mask to etch the silicon dioxide layer 306 and diffuse n- and p-type dopants to form n- and p-doped regions 304 and 305, respectively. The cell further includes metal contacts 307 in the dopant-diffused regions on the back side of n-type Si wafer 303 made by forming a seed layer stack which is thickened by additional metal layers, typically ≥20 µm of copper and ≥7 µm of tin. The pre-existing cell also typically will have a textured front surface, with an n-doped region 302 and an anti-reflection coating 301 on the textured front surface. A total thickness of the completed rear-contact solar cells typically will be about 165 µm, exhibiting a limited bending radius in the range from 50 mm to 60 mm. This starting cell is cleaned and inspected for any defects or cracks and its total thickness, including the back metal contacts, is then measured.

In a next step, the protective release liner is removed from a temporary bonding adhesive tape such as that described above with respect to FIG. 2, and as illustrated in FIG. 3B, the pre-existing thick solar cell is mounted backside-down to the adhesive layer 310 of the temporary bonding adhesive tape and held down with a pneumatic press to laminate it to the temporary bonding adhesive tape. A non-silicon rubber pad or a Teflon cloth is suitable for applying a pneumatic press and laminating the adhesive tape on the backside of the pre-existing cell without damage to the rear contacts of the cell. The thickness of the total mounted stack, including the thickness of the mounted cell and the temporary bonding adhesive tape, is then measured and compared to a predetermined desired final thickness of the cell, where the final thickness includes the thicknesses of the final n-type Si layer, the n-doped silicon dioxide layer 306, and the interdigitated contact lines on the backside of the cell, and an amount of material to be removed from the front side of the stack to achieve the desired final thickness is determined. Then, as described below, this amount of material is removed so that a cell having the predetermined desired final thickness can be obtained.

Figure 4A:
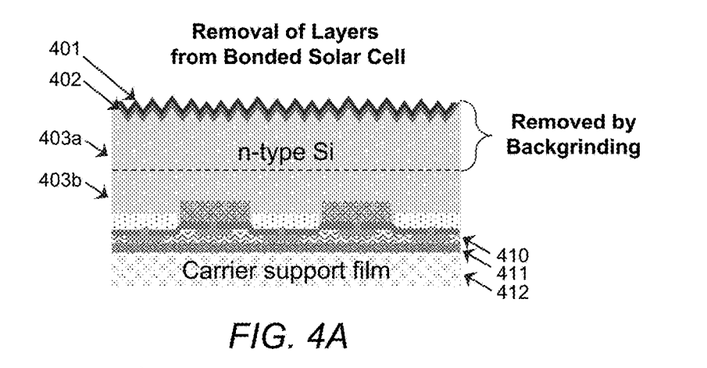
FIGS. 4A-4C are block schematics illustrating exemplary steps for removing layers from a bonded solar cell such as that illustrated in FIG. 3C in a method for manufacturing an ultra-thin flexible rear-contact Si solar cell in accordance with the present invention.

Thus, after the thickness of the stack is calculated and the amount of material from the stack to be removed is determined, as illustrated in FIG. 4A, the mounted stack is moved to a grinder where the thickness of the cell is reduced by a predetermined amount to obtain a cell having the predetermined desired final thickness determined as described above (including an allowance of about 40 µm to account for the interdigitated contact lines on the backside of the cell). The thickness of the pre-existing cell is reduced by removing the top antireflective layer 401 and n-doped region 402 if present in the original pre-existing cell, and further to remove a predetermined excess portion 403a of n-type Si layer, leaving only a thin portion 403b of the n-type Si layer having a thickness between about 1 µm and about 20 µm in the cell. The wafer thinning process can be accomplished using a simple single-step backgrinding process without the need for a high-cost chemical mechanic polishing (CMP) step. In the backgrinding process, the front surface of the mounted solar cell is coarsely ground to remove the excess material from the front surface of the cell at a thinning rate of about 1 µm/sec, with grinding proceeding until the predetermined thickness of the solar cell is achieved.

Figure 4B:
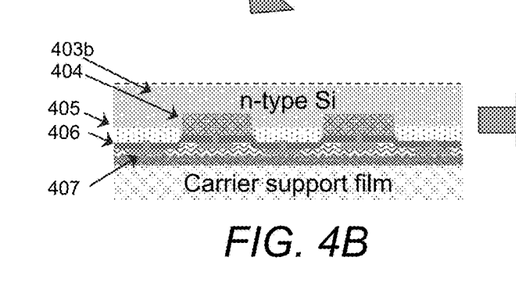
Figure 4C:
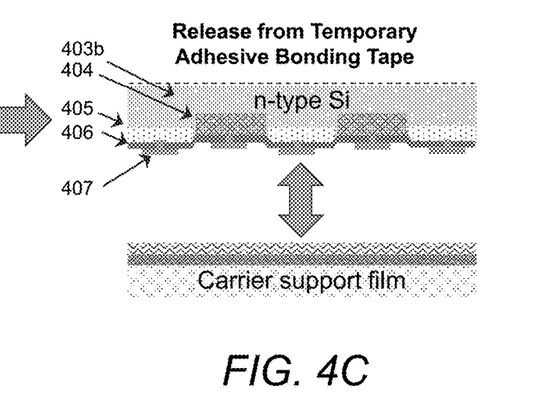

Once the cell has reached the desired thickness, the mounted stack which now includes the thus-thinned cell is placed at an elevated temperature between 70° C. and 150° C., depending on the melting temperature of the adhesive used in the temporary boding adhesive tape. and as illustrated in FIGS. 4B and 4C, the thinned solar cell is released from the temporary bonding adhesive tape once the temperature of the adhesive in the tape reaches its melting point, with debonding of the thinned cell from the temporary bonding adhesive tape being instantaneous once the melting temperature is reached. Any residual adhesive can be easily cleaned off the backside of the cell, e.g., with isopropyl alcohol. The final thickness of the thus-released cell is then measured to ensure that the cell has the predetermined desired thickness.

Figure 5:
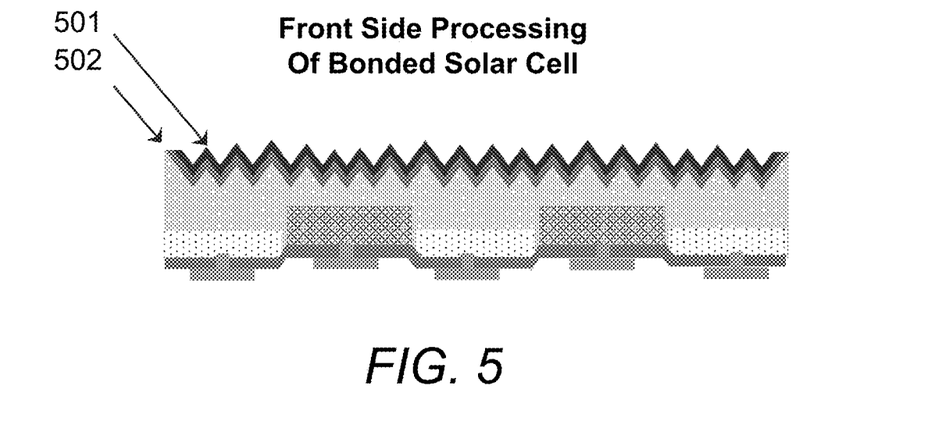
FIG. 5 is a block schematic illustrating aspects of front side processing of a bonded solar cell used in a method for manufacturing an ultra-thin flexible rear-contact Si solar cell in accordance with the present invention.

As illustrated in FIG. 5, in some embodiments, after the thinned solar cell is released from the temporary bonding adhesive tape, surface texturing can be performed on the front surface of the ultra-thin structure to form a plurality of random upright pyramids through chemical etching. In the preferred embodiment (100) oriented monocrystalline Si wafers are used. A KOH based solution is then used to preferentially expose the (111) planes of Si on the front side, forming a textured surface with random upright pyramids with height ranging from 1 µm to 5 µm. This texturing process increases roughness of the front surface that could increase light trapping, minimizing reflection loss of incident lights to the front surface.

In other embodiments, one or more layers of a tunnel layer passivating n-type semiconductor material 502 can be deposited onto the textured surface. On the textured front surface of the ultra-thin structure, surface passivation can be achieved through the deposition of an ultra-thin (<2 nm) tunneling layer, where the tunnel layer can comprise a layer of a dielectric such as $Al_2O_3$, $SiO_2$, or hydrogenated intrinsic amorphous Si. See W. Yoon, et al., "Transparent conducting oxide-based, passivated contacts for high efficiency crystalline Si solar cells," in 2015 *IEEE 42nd Photovoltaic Specialist Conference (PVSC)*, 2015, pp. 1-4 ("Yoon 2015"); and W. Yoon, et al., "Enhanced surface passivation of epitaxially grown emitters for high-efficiency ultrathin crystalline Si solar cells," in 2016 *IEEE 43rd Photovoltaic Specialists Conference (PVSC)*, 2016, pp. 3008-3010 ("Yoon 2016"). These layers can be deposited by any suitable process such as thermal atomic layer deposition (ALD), remote plasma ALD, plasma enhanced chemical vapor deposition (PECVD), wet oxidation, UV-ozone oxidation and DC/RF magnetron sputtering, or thermal- and e-beam evaporation. An n-type semiconducting layer 502 can then be deposited on passivating tunnel layer to introduces a barrier to minority carrier flow to the front surface. The minority carrier concentration is thus maintained at higher levels in the n-type Si base region and the n-type semiconductor layer has a net effect of passivating the front surface. The n-type semiconductor layer can include layers of materials such as $TiO_x$ or hydrogenated amorphous Si doped with phosphorus. For p-type Si base, the p-type semiconductor layers can include layers of materials such as $MoO_x$, $NiO_x$, and hydrogenated amorphous Si doped with boron. See Yoon 2016, supra. The optimal thickness of both n- and p-type semiconductors is in the range of 1 nm to 20 nm.

In some embodiments, one or more layers of high-quality dielectric materials such as $Al_2O_3$, $SiO_2$, $SiN_x$, $SiON_x$, or MgF can be deposited on the textured front side of the cell by any suitable process such as thermal atomic layer deposition (ALD), remote plasma ALD, plasma enhanced chemical vapor deposition (PECVD), and DC/RF sputtering, and thermal- and e-beam evaporation, where the dielectric layers serve as anti-reflection coating (ARC) layers 501 to further minimize reflection losses.

Advantages and New Features

The main advantage of the methods disclosed in this invention is simple and low cost method of fabrication of ultra-thin flexible silicon solar cells that have a rear-contact and rear junction. This method utilizes commercial off-the-shelf rear-contact Si solar cells including mono- and multi-crystalline Si solar cells This method can produce fully flexible and bendable rear-contact Si solar cells that preferably have a total cell thickness of less than 60 µm, and more preferably less than 50 µm.

In addition, this method can produce flexible mono- and multi-crystalline silicon solar cells that preferably exhibit a bend radius of less than 20 mm, and more preferably of less than 10 mm, from pre-existing commercial off-the-shelf solar cells having a bending radius of 50 mm to 60 mm.

Figure 6A:
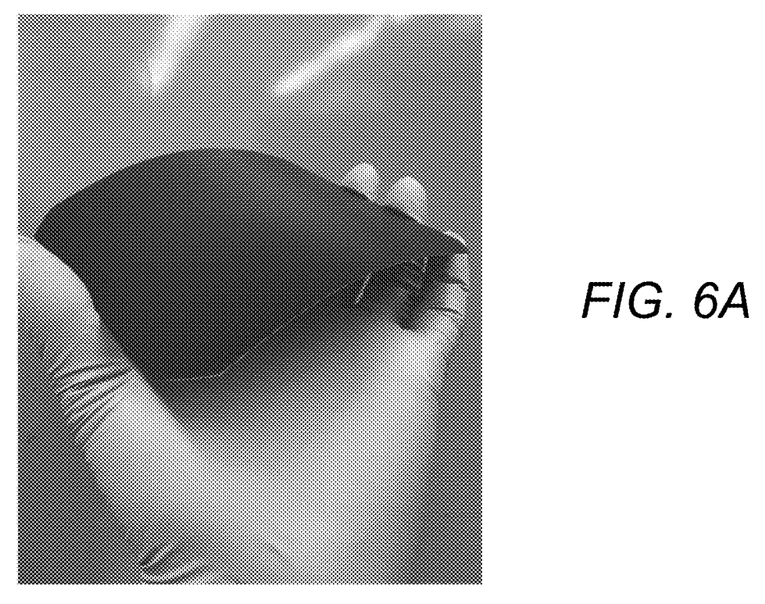
FIGS. 6A and 6B are photographic images illustrating the flexibility of a conventional thick Si solar cell (FIG. 6A) and of an ultra-thin Si solar cell manufactured from a conventional thick Si solar cell in accordance with the present invention (FIG. 6B).
Figure 6B:
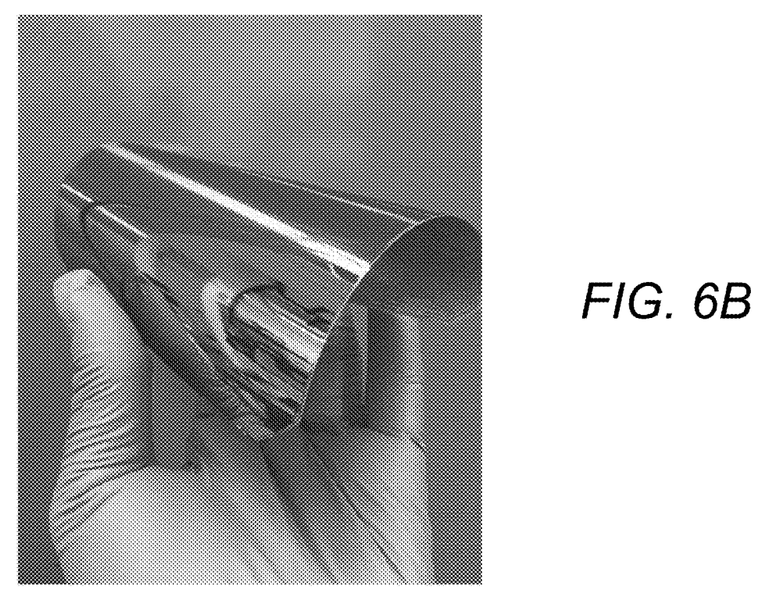

The photographic images in FIGS. 6A and 6B illustrate the ability of the method of the present invention to obtain an ultra-thin, flexible solar cell from a thick, inflexible one. FIG. 6A shows an exemplary commercially available monocrystalline Si solar cell used as a starting cell in the method of the present invention. This cell had a total thickness of 165 µm, and as can be easily seen from FIG. 6A, is quite inflexible. In contrast, FIG. 6B shows a highly flexible 60 µm-thick cell produced from such a thick inflexible cell using the mounting, backgrinding, and additional front-side processing steps of the method of the present invention.

Figure 7:
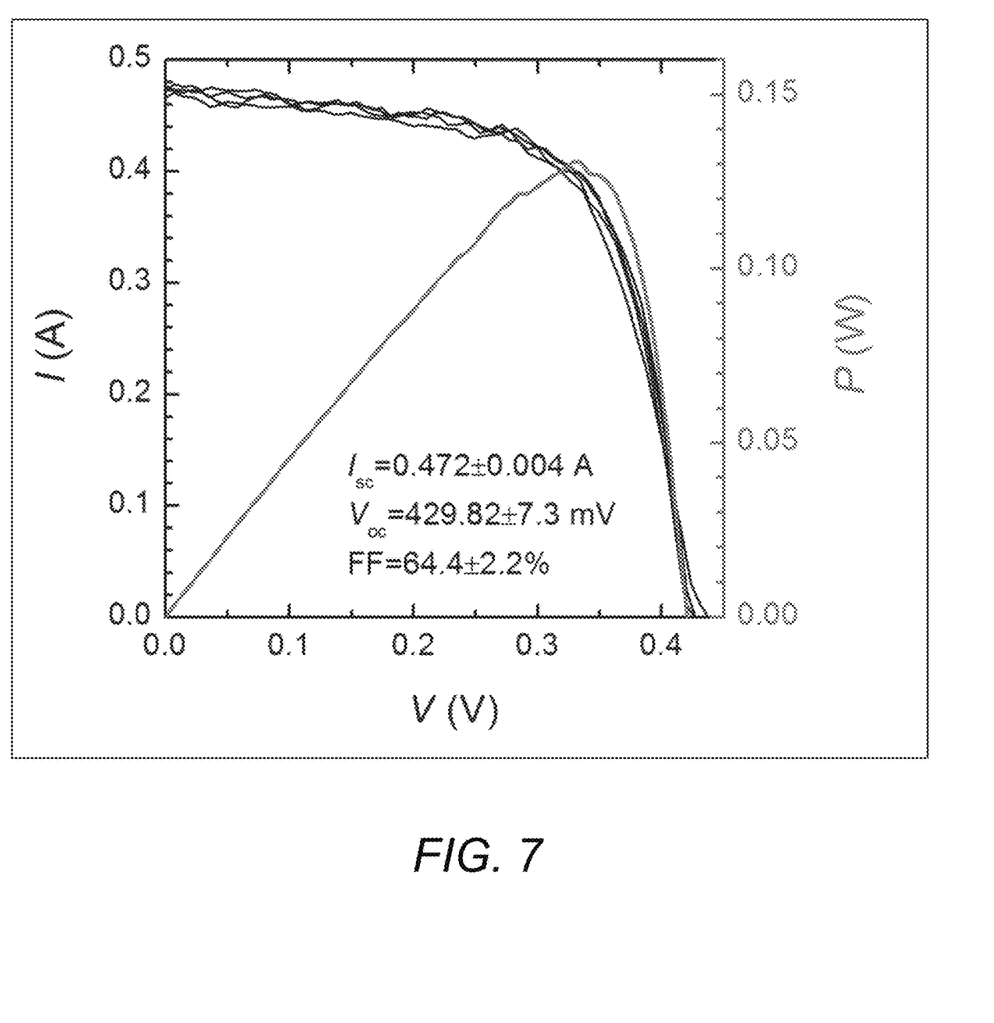
FIG. 7 is a plot showing a current-voltage curve of the thinned solar cell in FIG. 6B in response a to simulated solar spectrum of air mass 1.5 global with the irradiance of 100 mW/cm$^2$.

FIG. 7 is a plot showing a current-voltage curve of the cell shown in FIG. 6B when it is exposed to a simulated solar spectrum of air mass 1.5 global with the irradiance of 100 mW/cm². The plots in FIG. 7 show that the method of the present invention can produce ultra-thin flexible rear-contact solar cells without damaging any n- and p-doped regions or interdigitated-back contacts to n- and p-doped regions. After the temporary bonding-debonding and backgrinding processes of the present invention, the original cell is still intact, albeit much thinner, exhibiting a high fill factor (FF) of more than 60% and an open-circuit voltage ($V_{oc}$) of more than 400 mV. It will be noted that the cell shown in FIG. 6B has not yet undergone any surface processing such as surface texturing, application of an ARC layer, or formation of a front-surface field, and it is expected that the short-circuit current ($I_{sc}$) and the $V_{oc}$ will be even further improved after such surface processing has been implemented.

Thus, the method of the present invention can produce ultra-thin flexible mono- and multi-crystalline thin silicon solar cells that need no permanent supporting substrate attached to the cell due to the inherent cell structure of the robust thick interdigitated metal contact lines on the backside of solar cells.

Alternatives

The main alternative to the approach given here to produce rear-contact Si solar cell is the layer transfer process that requires surface re-conditioning and deposition or epitaxial growth of crystalline semiconductor layers using high-vacuum epitaxial tools for device layer formation and permanent supporting backplane. See Moslehi et all U.S. Patent Application Pub. No. 2013/0228221 A1. Other approach is stress induced exfoliation from wafers. However, solar cells fabricated via stress induced exfoliation has a front-contact front junction solar cell, suffering from low efficiency (~15%) with small area (~1 cm$^2$).

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for manufacturing an ultra-thin flexible rear-contact solar cell, comprising:

providing a pre-existing rear-contact solar cell having a Si material layer with a thickness of about 200 μm and a bending radius of about 50 mm to 60 mm,
   the pre-existing solar cell having a plurality of interdigitated n- and p-doped regions on a back side thereof, a plurality of metal grids having a thickness of about 20 μm to about 40 μm forming a corresponding plurality of interdigitated metal contacts to the n- and p-doped regions on the backside of the pre-existing solar cell;

providing a temporary bonding adhesive tape comprising an adhesive layer on a carrier support film, the temporary bonding adhesive tape having a thickness of about 300 μm to 500 μm;

mounting the pre-existing solar cell to the temporary bonding adhesive tape to form a mounted stack that includes the pre-existing solar cell, the metal grids, and the temporary bonding adhesive tape;

measuring a thickness of the mounted stack, comparing the thickness of the mounted stack to a predetermined thickness of a desired final solar cell, and determining a thickness of material to be removed from the pre-existing solar cell to achieve the predetermined desired thickness of the final solar cell;

grinding a front side of the pre-existing solar cell to remove material from the Si material layer to produce a thinned solar cell preferably having a Si material layer with a thickness of about 10 μm to about 20 μm, and more preferably having a Si materials layer with a thickens of about 1 μm to about 10 μm, wherein the mounted stack has a thickness equal to the predetermined desired thickness of the solar cell plus the thickness of metal grids and the thickness of the temporary bonding adhesive tape; and heating the stack with the thinned solar cell to a melting point of the adhesive in the temporary bonding adhesive tape, the thinned solar cell immediately disengaging from the temporary bonding adhesive tape when the melting point of the adhesive is reached;

wherein the final solar cell has a thickness of less than about 60 μm, more preferably has a thickness of less than about 50 μm and a bending radius of less than 20 mm, and more preferably of less than 10 mm.

2. The method according to claim 1, further including the steps of chemically etching the front surface of the final solar cell to form a textured front surface.

3. The method according to claim 2, wherein the textured front surface comprises a plurality of random upright pyramids.

4. The method according to claim 2, further including the step of depositing a passivating semiconductor material layer onto the textured front surface of the final solar cell.

5. The method according to claim 4, wherein the Si material layer is n-doped, and further wherein the passivating semiconductor material layer is an n-type semiconductor layer.

6. The method according to claim 5, wherein the passivating semiconductor material layer comprises $TiO_x$, or hydrogenated amorphous Si doped with phosphorus.

7. The method according to claim 4, wherein the Si material layer is p-doped, and further wherein the passivating semiconductor material layer is an p-type semiconductor layer.

8. The method according to claim 7, wherein the passivating semiconductor material layer comprises $MoO_x$, $NiO_x$, or hydrogenated amorphous Si doped with boron.

9. The method according to claim 2, w herein the passivating semiconductor material layer has a thickness of about 1 nm to about 20 nm.

10. The method according to claim 2, further including the step of depositing one or more layers of dielectric material as an anti-reflective coating on the textured front surface of the final solar cell.

11. The method according to claim 10, wherein the dielectric material comprises $Al_2O_3$, $SiO_2$, $SiN_x$, $SiON_x$, or MgF.

* * * * *